(12) United States Patent
Wang

(10) Patent No.: US 12,069,933 B2
(45) Date of Patent: Aug. 20, 2024

(54) OLED AUTOMATIC PRODUCTION EQUIPMENT

(71) Applicant: SHENZHEN CHINA STAR OPTOELECTRONICS SEMICONDUCTOR DISPLAY TECHNOLOGY CO., LTD., Guangdong (CN)

(72) Inventor: Keyuan Wang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 507 days.

(21) Appl. No.: 16/624,216

(22) PCT Filed: Dec. 5, 2019

(86) PCT No.: PCT/CN2019/123176
§ 371 (c)(1),
(2) Date: Oct. 4, 2021

(87) PCT Pub. No.: WO2021/097933
PCT Pub. Date: May 27, 2021

(65) Prior Publication Data
US 2022/0020970 A1 Jan. 20, 2022

(30) Foreign Application Priority Data
Nov. 22, 2019 (CN) .......................... 201911156625.6

(51) Int. Cl.
*H10K 71/00* (2023.01)
*G05B 19/4093* (2006.01)

(52) U.S. Cl.
CPC ......... *H10K 71/00* (2023.02); *G05B 19/4093* (2013.01); *G05B 2219/49023* (2013.01); *G05B 2219/49027* (2013.01)

(58) Field of Classification Search
CPC ..... H10K 71/00; H01L 51/0004; H01L 51/56; H01L 51/5206; H01L 51/5221;
(Continued)

(56) References Cited

U.S. PATENT DOCUMENTS

2004/0182318 A1   9/2004  Hashinoki et al.
2004/0206307 A1*  10/2004 Boroson ........... H01L 21/67167
                                                        427/457
(Continued)

FOREIGN PATENT DOCUMENTS

CN         1542994 A    11/2004
CN       101303596 A    11/2008
(Continued)

*Primary Examiner* — Caleb E Henry
(74) *Attorney, Agent, or Firm* — Geoffrey Lottenberg; Berger Singerman LLP

(57) ABSTRACT

An organic light emitting diode (OLED) automatic production equipment is provided. The OLED automatic production equipment includes a vapor deposition device, a printing device, a sputtering device, a flexible packaging device, and a thin film packaging device. The thin film packaging device is in communication with the vapor deposition device, the printing device, the sputtering device, the flexible packaging device, and the like. Processors of the vapor deposition device, the printing device, the sputtering device, and the flexible packaging device are configured to perform two-way communication with a processor of the thin film packaging device.

18 Claims, 1 Drawing Sheet

(58) Field of Classification Search
CPC ......... H01L 21/67161; H01L 21/67167; H01L 21/67207; H01L 21/67155; H01L 21/67276; B81B 7/008; C23C 14/12; C23C 14/228; G05B 19/4093; G05B 2219/49023; G05B 2219/49027
See application file for complete search history.

(56) References Cited

U.S. PATENT DOCUMENTS

| | | | |
|---|---|---|---|
| 2006/0290741 A1* | 12/2006 | Silverbrook | B41J 2/1646 347/47 |
| 2008/0117258 A1* | 5/2008 | Silverbrook | B41J 2/14427 347/47 |
| 2010/0097416 A1* | 4/2010 | Yoo | C23C 14/228 427/58 |
| 2010/0201749 A1* | 8/2010 | Somekh | B41J 11/0015 427/261 |
| 2010/0245479 A1* | 9/2010 | Forrest | B41J 2/005 347/47 |
| 2013/0208036 A1* | 8/2013 | Forrest | B41J 11/008 347/8 |
| 2018/0006107 A1 | 1/2018 | Cok | |
| 2019/0221783 A1* | 7/2019 | McGraw | C23C 16/45563 |
| 2019/0232325 A1* | 8/2019 | McGraw | B41J 2/1433 |
| 2019/0256968 A1* | 8/2019 | Quinn | C23C 14/12 |
| 2019/0363296 A1 | 11/2019 | Wang et al. | |
| 2019/0386257 A1* | 12/2019 | Quinn | H10K 71/00 |

FOREIGN PATENT DOCUMENTS

| | | |
|---|---|---|
| CN | 204333043 U | 5/2015 |
| CN | 108520921 A | 9/2018 |

\* cited by examiner

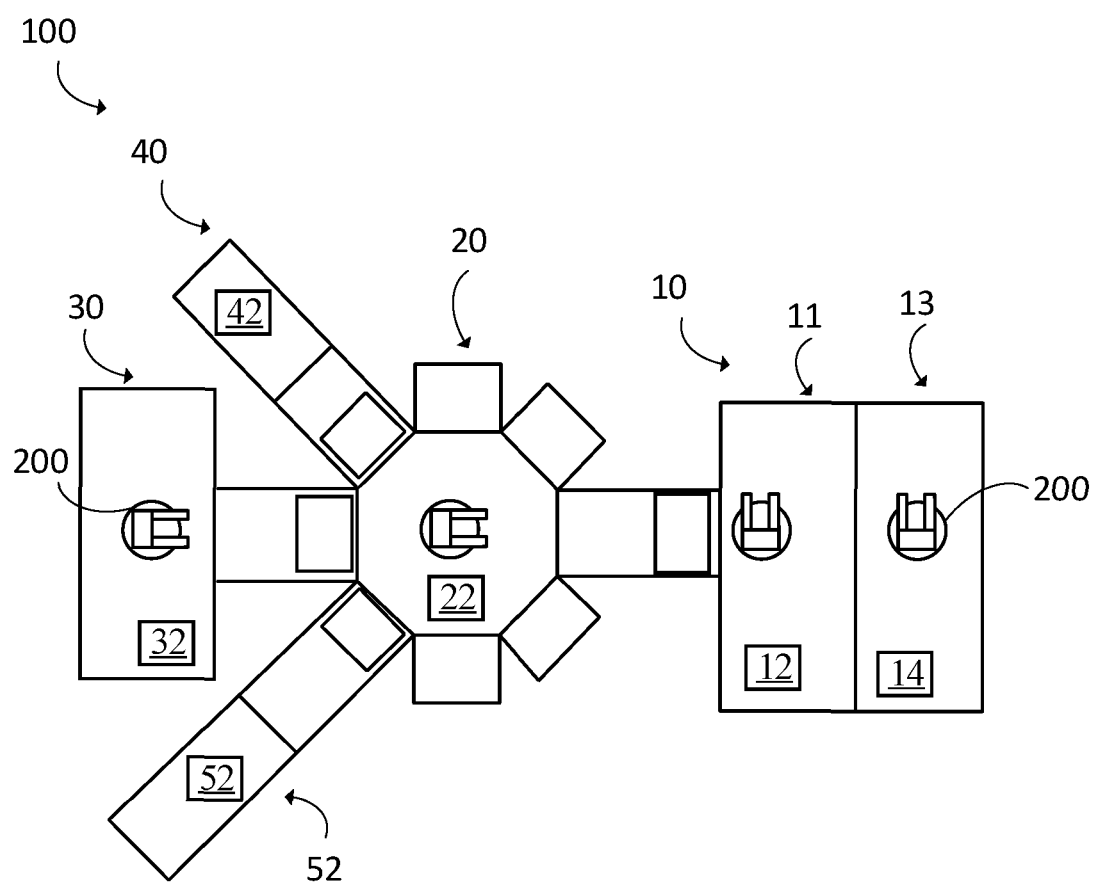

OLED AUTOMATIC PRODUCTION EQUIPMENT

CROSS-REFERENCE TO RELATED APPLICATIONS

This application is the National phase under 35 U.S.C. § 371 of International Application No. PCT/CN2019/123176, filed Dec. 5, 2019, which claims the benefit of and priority to Chinese Patent Application No. 201911156625.6, filed Nov. 22, 2019. The entire contents of these patent applications are hereby incorporated by reference herein.

FIELD OF INVENTION

The present disclosure relates to the field of display technologies, and more particularly to an organic light emitting diode (OLED) automatic production equipment.

BACKGROUND OF INVENTION

In the prior art, in current production mode of OLED devices, transmission between multiple devices is performed on a glass substrate by a manual command of a person. After passing through multiple complicated processes, according to experimental cases, multiple processes are required to combine the above multiple complex processes for 3-5 repetitive round-trip productions.

The current production mode of OLED devices has the following disadvantages:

1. Low experimental efficiency: Due to a long time span of each process, each process requires manual intervention by personnel, resulting in very low experimental efficiency and unable to support unmanned production. Multiple groups of experimental products require personnel to follow the production line for 24 hours.

2. Poor experiment yield: Due to human delay or misoperation, which causes timeout, the glass substrate cannot enter a next process at the optimal time, which affects yield of an experimental product or makes mistakes or misses the process sequence, thereby increasing experiment failure rate.

3. Low experiment flexibility: Because an equipment vendor's software is not intelligent enough, the production line cannot adapt to a variety of experimental procedures or temporary innovation procedures, and secondary software changes are required, resulting in limited experimental methods and innovation.

4. Poor experiment confidentiality: Because a design of each new process flow requires equipment vendors to modify a software, a experimental logic, experimental ideas, and experimental methods are exposed to an equipment supplier. It does not benefit confidentiality of core technology research and development.

Therefore, it is necessary to provide an OLED automatic production equipment to solve issues existing in the prior art.

SUMMARY OF INVENTION

In order to solve the above technical problems, an object of the present disclosure is to provide an OLED automatic production equipment, which can realize automatic production, improve yield, can be configured with different production processes, and improve experimental flexibility.

To achieve the above object, an embodiment of the present disclosure provides an OLED automatic production equipment. The OLED automatic production equipment comprises a vapor deposition device, a printing device, a sputtering device, a flexible packaging device, and a thin film packaging device. The vapor deposition device is configured to transfer a glass substrate and comprises a processor. The printing device is configured to transfer the glass substrate and comprises a processor. The sputtering device is configured to transfer the glass substrate and comprises a processor. The flexible packaging device is configured to transfer the glass substrate and comprises a processor. The thin film packaging device is configured to transfer the glass substrate and comprises a processor. The thin film packaging device is in communication with the vapor deposition device, the printing device, the sputtering device, and the flexible packaging device. The processor of the vapor deposition device is configured to perform two-way communication with the processor of the thin film packaging device, and when the processor of the vapor deposition device and the processor of the thin film packaging device perform two-way communication, the vapor deposition device transfers the glass substrate to the thin film packaging device, the vapor deposition device receives the glass substrate from the thin film packaging device, and the processor of the vapor deposition device and the processor of the thin film packaging device perform two-way communication of glass substrate transmitting message. The processor of the vapor deposition device is configured to process tape-out standards and specifications of the vapor deposition device, such that the two-way communication of the glass substrate transmitting message and transmission of the glass substrate on the vapor deposition device match each other. The processor of the thin film packaging device is configured to process tape-out standards and specifications of the thin film packaging device, such that the two-way communication of the glass substrate transmitting message and transmission of the glass substrate on the thin film packaging device match each other.

In an embodiment of the present disclosure, the processor of the printing device is configured to perform two-way communication with the processor of the thin film packaging device, and when the processor of the printing device and the processor of the thin film packaging device perform two-way communication, the printing device transfers the glass substrate to the thin film packaging device, the printing device receives the glass substrate from the thin film packaging device, and the processor of the printing device and the processor of the thin film packaging device perform two-way communication of glass substrate transmitting message.

In an embodiment of the present disclosure, the processor of the printing device is configured to process tape-out standards and specifications of the printing device, such that the two-way communication of the glass substrate transmitting message and transmission of the glass substrate on the printing device match each other.

In an embodiment of the present disclosure, the processor of the sputtering device is configured to perform two-way communication with the processor of the thin film packaging device, and when the processor of the sputtering device and the processor of the thin film packaging device perform two-way communication, the sputtering device transfers the glass substrate to the thin film packaging device, the sputtering device receives the glass substrate from the thin film packaging device, and the processor of the sputtering device and the processor of the thin film packaging device perform two-way communication of glass substrate transmitting message.

In an embodiment of the present disclosure, the processor of the sputtering device is configured to process tape-out standards and specifications of the sputtering device, such that the two-way communication of the glass substrate transmitting message and transmission of the glass substrate on the sputtering device match each other.

In an embodiment of the present disclosure, the processor of the flexible packaging device is configured to perform two-way communication with the processor of the thin film packaging device, and when the processor of the flexible packaging device and the processor of the thin film packaging device perform two-way communication, the flexible packaging device transfers the glass substrate to the thin film packaging device, the flexible packaging device receives the glass substrate from the thin film packaging device, and the processor of the flexible packaging device and the processor of the thin film packaging device perform two-way communication of glass substrate transmitting message.

In an embodiment of the present disclosure, the processor of the flexible packaging device is configured to process tape-out standards and specifications of the flexible packaging device, such that the two-way communication of the glass substrate transmitting message and transmission of the glass substrate on the flexible packaging device match each other.

In an embodiment of the present disclosure, the processor of the vapor deposition device sets a maximum number of vapor deposition processes is five, and the processor of the thin film packaging device sets a maximum number of thin film packaging processes is five.

An embodiment of the present disclosure further provides an OLED automatic production equipment. The OLED automatic production equipment comprises a vapor deposition device, a printing device, a sputtering device, a flexible packaging device, and a thin film packaging device. The vapor deposition device is configured to transfer a glass substrate and comprises a processor. The printing device is configured to transfer the glass substrate and comprises a processor. The sputtering device is configured to transfer the glass substrate and comprises a processor. The flexible packaging device is configured to transfer the glass substrate and comprises a processor. The thin film packaging device is configured to transfer the glass substrate and comprises a processor. The thin film packaging device is in communication with the vapor deposition device, the printing device, the sputtering device, and the flexible packaging device. The processor of the vapor deposition device is configured to perform two-way communication with the processor of the thin film packaging device, and when the processor of the vapor deposition device and the processor of the thin film packaging device perform two-way communication, the vapor deposition device transfers the glass substrate to the thin film packaging device, the vapor deposition device receives the glass substrate from the thin film packaging device, and the processor of the vapor deposition device and the processor of the thin film packaging device perform two-way communication of glass substrate transmitting message.

In an embodiment of the present disclosure, the processor of the vapor deposition device is configured to process tape-out standards and specifications of the vapor deposition device, such that the two-way communication of the glass substrate transmitting message and transmission of the glass substrate on the vapor deposition device match each other.

In an embodiment of the present disclosure, the processor of the thin film packaging device is configured to process tape-out standards and specifications of the thin film packaging device, such that the two-way communication of the glass substrate transmitting message and transmission of the glass substrate on the thin film packaging device match each other.

In an embodiment of the present disclosure, the processor of the printing device is configured to perform two-way communication with the processor of the thin film packaging device, and when the processor of the printing device and the processor of the thin film packaging device perform two-way communication, the printing device transfers the glass substrate to the thin film packaging device, the printing device receives the glass substrate from the thin film packaging device, and the processor of the printing device and the processor of the thin film packaging device perform two-way communication of glass substrate transmitting message.

In an embodiment of the present disclosure, the processor of the printing device is configured to process tape-out standards and specifications of the printing device, such that the two-way communication of the glass substrate transmitting message and transmission of the glass substrate on the printing device match each other.

In an embodiment of the present disclosure, the processor of the sputtering device is configured to perform two-way communication with the processor of the thin film packaging device, and when the processor of the sputtering device and the processor of the thin film packaging device perform two-way communication, the sputtering device transfers the glass substrate to the thin film packaging device, the sputtering device receives the glass substrate from the thin film packaging device, and the processor of the sputtering device and the processor of the thin film packaging device perform two-way communication of glass substrate transmitting message.

In an embodiment of the present disclosure, the processor of the sputtering device is configured to process tape-out standards and specifications of the sputtering device, such that the two-way communication of the glass substrate transmitting message and transmission of the glass substrate on the sputtering device match each other.

In an embodiment of the present disclosure, the processor of the flexible packaging device is configured to perform two-way communication with the processor of the thin film packaging device, and when the processor of the flexible packaging device and the processor of the thin film packaging device perform two-way communication, the flexible packaging device transfers the glass substrate to the thin film packaging device, the flexible packaging device receives the glass substrate from the thin film packaging device, and the processor of the flexible packaging device and the processor of the thin film packaging device perform two-way communication of glass substrate transmitting message.

In an embodiment of the present disclosure, the processor of the flexible packaging device is configured to process tape-out standards and specifications of the flexible packaging device, such that the two-way communication of the glass substrate transmitting message and transmission of the glass substrate on the flexible packaging device match each other.

In an embodiment of the present disclosure, the processor of the vapor deposition device sets a maximum number of vapor deposition processes is five, and the processor of the thin film packaging device sets a maximum number of thin film packaging processes is five.

Beneficial effects of the present application are that: because the OLED automatic production equipment in an embodiment of the present disclosure includes a vapor deposition device, a printing device, a sputtering device, a flexible packaging device, and a thin film packaging device. The vapor deposition device, the printing device, the sputtering device, and the flexible packaging device are configured to transfer a glass substrate and include processors. The thin film packaging device is configured to transfer the glass substrate and includes the processor. The processors of the vapor deposition device, the printing device, the sputtering device, and the flexible packaging device are configured to perform two-way communication with the processor of the thin film packaging device. When the processors of the vapor deposition device, the printing device, the sputtering device, and the flexible packaging device communicate with the processor of the thin film packaging device, the vapor deposition device, the printing device, the sputtering device, and the flexible packaging device transfer the glass substrate to the thin film packaging device. The vapor deposition device, the printing device, the sputtering device, and the flexible packaging device receive the glass substrate from the thin film packaging device. The processors of the vapor deposition device, the printing device, the sputtering device, and the flexible packaging device and the processor of the thin film packaging device perform two-way communication of glass substrate transmitting message. Through the embodiment of this disclosure, automatic production can be achieved, yield can be improved, different production processes can be configured, and experimental flexibility can be improved.

DESCRIPTION OF DRAWINGS

In order to explain the technical solution in the embodiment or the prior art more clearly, the drawings used in the description of the embodiment or the prior art will be briefly introduced below. Obviously, the drawings in the following description are only some of the disclosed embodiments. For those of ordinary skill in the art, other drawings can be obtained based on these drawings without paying creative efforts.

FIG. 1 is a schematic structural diagram of an OLED automatic production equipment according to an embodiment of the present disclosure.

DETAILED DESCRIPTION OF PREFERRED EMBODIMENTS

The following descriptions of the embodiments are made with reference to additional illustrations to illustrate specific embodiments that the present disclosure can be implemented with. The directional terms mentioned in this disclosure, such as up, down, front, back, left, right, inside, outside, side, etc., are only directions referring to the attached drawings. Therefore, the terminology used is to explain and understand the disclosure, but not to limit the disclosure. In the figure, similarly structured units are denoted by the same reference numerals.

Referring to FIG. 1, an embodiment of the present disclosure further provides an OLED automatic production equipment 100. The OLED automatic production equipment 100 comprises a vapor deposition device 10, a printing device 30, a sputtering device 40, a flexible packaging device 50, and a thin film packaging device 20. The vapor deposition device 10 is configured to transfer a glass substrate 200 and comprises a processor. The printing device 30 is configured to transfer the glass substrate 200 and comprises a processor 32. The sputtering device 40 is configured to transfer the glass substrate 200 and comprises a processor 42. The flexible packaging device 50 is configured to transfer the glass substrate 200 and comprises a processor 52. The thin film packaging device 20 is configured to transfer the glass substrate 200 and comprises a processor 22. The thin film packaging device 20 is in communication with the vapor deposition device 10, the printing device 30, the sputtering device 40, and the flexible packaging device 50. The processor of the vapor deposition device is configured to perform two-way communication with the processor of the thin film packaging device, and when the processor of the vapor deposition device 10 and the processor 22 of the thin film packaging device 20 perform two-way communication, the vapor deposition device 10 transfers the glass substrate 200 to the thin film packaging device 20, the vapor deposition device 10 receives the glass substrate 200 from the thin film packaging device 20, and the processor of the vapor deposition device 10 and the processor 22 of the thin film packaging device 20 perform two-way communication of glass substrate transmitting message. Through the embodiment of this disclosure, automatic production can be achieved, yield can be improved, different production processes can be configured, and experimental flexibility can be improved.

In details, in an embodiment of the present disclosure, the vapor deposition device 10 is configured to process tape-out standards and specifications of the vapor deposition device 10, such that the two-way communication of the glass substrate transmitting message and transmission of the glass substrate 200 on the vapor deposition device 10 match each other. In an embodiment of the present disclosure, the processor of the vapor deposition device 10 sets a maximum number of vapor deposition processes is five, and the processor 22 of the thin film packaging device 20 sets a maximum number of thin film packaging processes is five.

Specifically, in one embodiment of the present disclosure, the vapor deposition device 10 includes a first vapor deposition device 11 and a second vapor deposition device 13. The first vapor deposition device 11 is configured to transfer the glass substrate 200 and includes a processor 12. The second vapor deposition device 13 is configured to transfer the glass substrate 200 and includes a processor 14. The first vapor deposition device 11 is in communication with the second vapor deposition device 13. The thin film packaging device 20 is in communication with the first vapor deposition device 11. The thin film packaging device 20 is in communication with the second vapor deposition device 13. The processor 12 of the first vapor deposition device 11 is configured to perform two-way communicate with the processor 14 of the second vapor deposition device 13. When the processor 12 of the first vapor deposition device 11 performs two-way communicate with the processor 14 of the second vapor deposition device 13, the first vapor deposition device 11 transfers the glass substrate 200 to the second vapor deposition device 13, the first vapor deposition device 11 receives the glass substrate 200 from the second vapor deposition device 13, and the processor 12 of the first vapor deposition device 11 and the processor 14 of the second vapor deposition device 13 perform two-way communication of glass substrate transmitting message. Through the embodiment of this disclosure, automatic production can be achieved, yield can be improved, different production processes can be configured, and experimental flexibility can be improved.

The processor 12 of the first vapor deposition device 11 is configured to perform two-way communication with the processor 22 of the thin film packaging device 20, and when the processor 12 of the first vapor deposition device 11 and the processor 22 of the thin film packaging device 20 perform two-way communication, the first vapor deposition device 11 transfers the glass substrate 200 to the thin film packaging device 20, the first vapor deposition device 11 receives the glass substrate 200 from the thin film packaging device 20, and the processor 12 of the first vapor deposition device 11 and the processor 22 of the thin film packaging device 20 perform two-way communication of glass substrate transmitting message. Through the embodiment of this disclosure, automatic production can be achieved, yield can be improved, different production processes can be configured, and experimental flexibility can be improved.

The processor 14 of the second vapor deposition device 13 is configured to perform two-way communication with the processor 22 of the thin film packaging device 20, and when the processor 14 of the second vapor deposition device 14 and the processor 22 of the thin film packaging device 20 perform two-way communication, the second vapor deposition device 13 transfers the glass substrate 200 to the thin film packaging device 20, the second vapor deposition device 13 receives the glass substrate 200 from the thin film packaging device 20, and the processor 14 of the second vapor deposition device 13 and the processor 22 of the thin film packaging device 20 perform two-way communication of glass substrate transmitting message. Through the embodiment of this disclosure, automatic production can be achieved, yield can be improved, different production processes can be configured, and experimental flexibility can be improved.

In details, in an embodiment of the present disclosure, the processor 22 of the thin film packaging device 20 is configured to process tape-out standards and specifications of the thin film packaging device 20, such that the two-way communication of the glass substrate transmitting message and transmission of the glass substrate 200 on the thin film packaging device 20 match each other.

In details, in an embodiment of the present disclosure, the OLED automatic production device 100 further includes a printing device 30. The processor 32 of the printing device 30 is configured to perform two-way communication with the processor 22 of the thin film packaging device 20, and when the processor 32 of the printing device 30 and the processor 22 of the thin film packaging device 20 perform two-way communication, the printing device 30 transfers the glass substrate 200 to the thin film packaging device 20, the printing device 30 receives the glass substrate 200 from the thin film packaging device 20, and the processor 32 of the printing device 30 and the processor 22 of the thin film packaging device 20 perform two-way communication of glass substrate transmitting message. In an embodiment of the present disclosure, the processor 32 of the printing device 30 is configured to process tape-out standards and specifications of the printing device 30, such that the two-way communication of the glass substrate transmitting message and transmission of the glass substrate 200 on the printing device 30 match each other. The printing device 30 is, for example, an inkjet printing device.

In details, in an embodiment of the present disclosure, the processor 42 of the sputtering device 40 is configured to perform two-way communication with the processor 22 of the thin film packaging device 20, and when the processor 42 of the sputtering device 40 and the processor 22 of the thin film packaging device 20 perform two-way communication, the sputtering device 40 transfers the glass substrate 200 to the thin film packaging device 20, the sputtering device 40 receives the glass substrate 200 from the thin film packaging device 20, and the processor 42 of the sputtering device 40 and the processor 22 of the thin film packaging device 20 perform two-way communication of glass substrate transmitting message. In an embodiment of the present disclosure, the processor 42 of the sputtering device 40 is configured to process tape-out standards and specifications of the sputtering device 40, such that the two-way communication of the glass substrate transmitting message and transmission of the glass substrate 200 on the sputtering device 40 match each other.

In details, in an embodiment of the present disclosure, the processor 52 of the flexible packaging device 50 is configured to perform two-way communication with the processor 22 of the thin film packaging device 20, and when the processor 52 of the flexible packaging device 50 and the processor 22 of the thin film packaging device 20 perform two-way communication, the flexible packaging device 50 transfers the glass substrate 200 to the thin film packaging device 20, the flexible packaging device 50 receives the glass substrate 200 from the thin film packaging device 20, and the processor 52 of the flexible packaging device 50 and the processor 22 of the thin film packaging device 20 perform two-way communication of glass substrate transmitting message. In an embodiment of the present disclosure, the processor 52 of the flexible packaging device 50 is configured to process tape-out standards and specifications of the flexible packaging device 50, such that the two-way communication of the glass substrate transmitting message and transmission of the glass substrate 200 on the flexible packaging device 50 match each other.

In one embodiment of the present disclosure, the OLED automatic production equipment 100 implements compatibility and path configurability solutions of different glass substrates 200 transferred on the vapor deposition device 10, the thin film packaging device 20, the printing device 30, the sputtering device 40, and the flexible packaging device 50 through software, equipment specification communication interfaces, and streamer modular design. In one embodiment of the present disclosure, the OLED automatic production equipment 100 edits and sets production process data through computer software and equipment specification communication interfaces to implement automatic waiting for production, so as to improve experimental efficiency and yield, and increase experimental flexibility and confidentiality of the experiment.

In one embodiment of the present disclosure, the OLED automatic production equipment 100 implements automatic waiting production through the following embodiments to improve the experiment efficiency, improve the yield, and increase the experiment flexibility and the confidentiality of the experiment.

1. Develop a standard for tape-out of the vapor deposition device 10. Through the specification, ask the equipment manufacturer to modify the software transfer program. It enables the vapor deposition device 10 to transfer/receive the glass substrate 200 to/from the thin film packaging device 20 and performs two-way transmission of glass substrate information.

2. Formulate the tape-out standards and specifications of the thin film packaging device 20 and request the device to match the two-way transmission of glass substrate information with the transmission process of the glass substrate 200 in software.

3. Formulate standard communication specifications for the two-line film transfer of the printing device 30, the sputtering device 40, the flexible packaging device 50, and the thin film packaging device 20. The two-way transmission of the glass substrate information matches the transmission process of the glass substrate 200, and the glass substrate information is updated according to the actual production process.

4. Develop tracking data specifications for glass substrate information. The vapor deposition device 10, the thin film packaging device 20, the printing device 30, the sputtering device 40 and the flexible packaging device 50 use respective processors, such as a programmable logic controller (PLC), when reading/writing the information of the glass substrate, they can obtain the process record data of the glass substrate and write the new process record data of the glass substrate.

5. Formulate the logic setting specification for automatic transfer. The vapor deposition device 10 is required to be modified and added with automatic film transfer to the thin film packaging device 20. According to the process recording data of the process recording index data (tracking data) in the glass substrate information. The flow direction of the glass substrate 200 is determined. The next flow action of the glass substrate 200 is determined.

6. Formulate a schedule setting function for the thin film packaging device 20 to automatically operate the flow direction of the glass substrate 200. The logic judgment function is performed according to the single-step decomposition in which the flow direction of the glass substrate 200 has been set. Data is recorded according to the flow in the glass substrate information. Intelligently match schedule targets to find the next tape-out step. The glass substrate 200 is automatically sent to the next destination.

7. The vapor deposition device 10 and the thin film packaging device 20 both set a maximum expansion of 5 times (the industry standard is 3) for the process recording data parameters, which can make the automatic experiment range further exceed the industry standard.

In one embodiment of the present disclosure, the OLED automatic production equipment 100 can achieve the following beneficial effects. 1. The experiment efficiency is improved, the production is automatic, and the output is doubled. 2. Effectively prevent personnel misoperation, avoid wrong process and overtime, and improve yield. 3. After the introduction of the OLED automatic production equipment 100, different production processes can be configured to improve experimental flexibility. 4. Because the configuration information is in the OLED automatic production equipment 100, and it is divided into independent modular configurations along with the equipment, the equipment does not contain production process code information, and the entire experimental logic, process, and method of a production line can reach highly confidential effect.

Beneficial effects of the present application are that: because the OLED automatic production equipment in an embodiment of the present disclosure includes a vapor deposition device, a printing device, a sputtering device, a flexible packaging device, and a thin film packaging device. The vapor deposition device, the printing device, the sputtering device, and the flexible packaging device are configured to transfer a glass substrate and include processors. The thin film packaging device is configured to transfer the glass substrate and includes the processor. The processors of the vapor deposition device, the printing device, the sputtering device, and the flexible packaging device are configured to perform two-way communication with the processor of the thin film packaging device. When the processors of the vapor deposition device, the printing device, the sputtering device, and the flexible packaging device communicate with the processor of the thin film packaging device, the vapor deposition device, the printing device, the sputtering device, and the flexible packaging device transfer the glass substrate to the thin film packaging device. The vapor deposition device, the printing device, the sputtering device, and the flexible packaging device receive the glass substrate from the thin film packaging device. The processors of the vapor deposition device, the printing device, the sputtering device, and the flexible packaging device and the processor of the thin film packaging device perform two-way communication of glass substrate transmitting message. Through the embodiment of this disclosure, automatic production can be achieved, yield can be improved, different production processes can be configured, and experimental flexibility can be improved.

In summary, although the present disclosure has been disclosed as above with preferred embodiments, the above preferred embodiments are not intended to limit the present disclosure. Those of ordinary skill in the art can make various modifications and decorations without departing from the spirit and scope of the present disclosure. Therefore, the protection scope of the present disclosure is subject to the scope defined by the claims.

What is claimed is:

1. An organic light emitting diode (OLED) automatic production equipment, comprising:
   a vapor deposition device configured to transfer a glass substrate and comprising a processor;
   a printing device configured to transfer the glass substrate and comprising a processor;
   a sputtering device configured to transfer the glass substrate and comprising a processor;
   a flexible packaging device configured to transfer the glass substrate and comprising a processor; and
   a thin film packaging device configured to transfer the glass substrate and comprising a processor, wherein the thin film packaging device is in communication with the vapor deposition device, the printing device, the sputtering device, and the flexible packaging device;
   wherein the processor of the vapor deposition device is configured to perform two-way communication with the processor of the thin film packaging device, and when the processor of the vapor deposition device and the processor of the thin film packaging device perform two-way communication, the vapor deposition device transfers the glass substrate to the thin film packaging device, the vapor deposition device receives the glass substrate from the thin film packaging device, and the processor of the vapor deposition device and the processor of the thin film packaging device perform two-way communication of glass substrate transmitting message;
   wherein the processor of the vapor deposition device is configured to process tape-out standards and specifications of the vapor deposition device, such that the two-way communication of the glass substrate transmitting message and transmission of the glass substrate on the vapor deposition device match each other;
   wherein the processor of the thin film packaging device is configured to process tape-out standards and specifications of the thin film packaging device, such that the two-way communication of the glass substrate transmitting message and transmission of the glass substrate on the thin film packaging device match each other.

2. The OLED automatic production equipment according to claim 1, wherein the processor of the printing device is configured to perform two-way communication with the processor of the thin film packaging device, and when the processor of the printing device and the processor of the thin film packaging device perform two-way communication, the printing device transfers the glass substrate to the thin film packaging device, the printing device receives the glass substrate from the thin film packaging device, and the processor of the printing device and the processor of the thin film packaging device perform two-way communication of glass substrate transmitting message.

3. The OLED automatic production equipment according to claim 2, wherein the processor of the printing device is configured to process tape-out standards and specifications of the printing device, such that the two-way communication of the glass substrate transmitting message and transmission of the glass substrate on the printing device match each other.

4. The OLED automatic production equipment according to claim 2, wherein the processor of the sputtering device is configured to perform two-way communication with the processor of the thin film packaging device, and when the processor of the sputtering device and the processor of the thin film packaging device perform two-way communication, the sputtering device transfers the glass substrate to the thin film packaging device, the sputtering device receives the glass substrate from the thin film packaging device, and the processor of the sputtering device and the processor of the thin film packaging device perform two-way communication of glass substrate transmitting message.

5. The OLED automatic production equipment according to claim 4, wherein the processor of the sputtering device is configured to process tape-out standards and specifications of the sputtering device, such that the two-way communication of the glass substrate transmitting message and transmission of the glass substrate on the sputtering device match each other.

6. The OLED automatic production equipment according to claim 2, wherein the processor of the flexible packaging device is configured to perform two-way communication with the processor of the thin film packaging device, and when the processor of the flexible packaging device and the processor of the thin film packaging device perform two-way communication, the flexible packaging device transfers the glass substrate to the thin film packaging device, the flexible packaging device receives the glass substrate from the thin film packaging device, and the processor of the flexible packaging device and the processor of the thin film packaging device perform two-way communication of glass substrate transmitting message.

7. The OLED automatic production equipment according to claim 6, wherein the processor of the flexible packaging device is configured to process tape-out standards and specifications of the flexible packaging device, such that the two-way communication of the glass substrate transmitting message and transmission of the glass substrate on the flexible packaging device match each other.

8. The OLED automatic production equipment according to claim 1, wherein the processor of the vapor deposition device sets a maximum number of vapor deposition processes is five, and the processor of the thin film packaging device sets a maximum number of thin film packaging processes is five.

9. An OLED automatic production equipment, comprising:
a vapor deposition device configured to transfer a glass substrate and comprising a processor;
a printing device configured to transfer the glass substrate and comprising a processor;
a sputtering device configured to transfer the glass substrate and comprising a processor;
a flexible packaging device configured to transfer the glass substrate and comprising a processor; and
a thin film packaging device configured to transfer the glass substrate and comprising a processor, wherein the thin film packaging device is in communication with the vapor deposition device, the printing device, the sputtering device, and the flexible packaging device;
wherein the processor of the vapor deposition device is configured to perform two-way communication with the processor of the thin film packaging device, and when the processor of the vapor deposition device and the processor of the thin film packaging device perform two-way communication, the vapor deposition device transfers the glass substrate to the thin film packaging device, the vapor deposition device receives the glass substrate from the thin film packaging device, and the processor of the vapor deposition device and the processor of the thin film packaging device perform two-way communication of glass substrate transmitting message.

10. The OLED automatic production equipment according to claim 9, wherein the processor of the vapor deposition device is configured to process tape-out standards and specifications of the vapor deposition device, such that the two-way communication of the glass substrate transmitting message and transmission of the glass substrate on the vapor deposition device match each other.

11. The OLED automatic production equipment according to claim 9, wherein the processor of the thin film packaging device is configured to process tape-out standards and specifications of the thin film packaging device, such that the two-way communication of the glass substrate transmitting message and transmission of the glass substrate on the thin film packaging device match each other.

12. The OLED automatic production equipment according to claim 9, wherein the processor of the printing device is configured to perform two-way communication with the processor of the thin film packaging device, and when the processor of the printing device and the processor of the thin film packaging device perform two-way communication, the printing device transfers the glass substrate to the thin film packaging device, the printing device receives the glass substrate from the thin film packaging device, and the processor of the printing device and the processor of the thin film packaging device perform two-way communication of glass substrate transmitting message.

13. The OLED automatic production equipment according to claim 12, wherein the processor of the printing device is configured to process tape-out standards and specifications of the printing device, such that the two-way communication of the glass substrate transmitting message and transmission of the glass substrate on the printing device match each other.

14. The OLED automatic production equipment according to claim 12, wherein the processor of the sputtering device is configured to perform two-way communication with the processor of the thin film packaging device, and when the processor of the sputtering device and the processor of the thin film packaging device perform two-way communication, the sputtering device transfers the glass substrate to the thin film packaging device, the sputtering device receives the glass substrate from the thin film packaging device, and the processor of the sputtering device and the processor of the thin film packaging device perform two-way communication of glass substrate transmitting message.

15. The OLED automatic production equipment according to claim 14, wherein the processor of the sputtering device is configured to process tape-out standards and specifications of the sputtering device, such that the two-way communication of the glass substrate transmitting message and transmission of the glass substrate on the sputtering device match each other.

16. The OLED automatic production equipment according to claim 12, wherein the processor of the flexible packaging device is configured to perform two-way communication with the processor of the thin film packaging device, and when the processor of the flexible packaging device and the processor of the thin film packaging device perform two-way communication, the flexible packaging device transfers the glass substrate to the thin film packaging device, the flexible packaging device receives the glass substrate from the thin film packaging device, and the processor of the flexible packaging device and the processor of the thin film packaging device perform two-way communication of glass substrate transmitting message.

17. The OLED automatic production equipment according to claim 16, wherein the processor of the flexible packaging device is configured to process tape-out standards and specifications of the flexible packaging device, such that the two-way communication of the glass substrate transmitting message and transmission of the glass substrate on the flexible packaging device match each other.

18. The OLED automatic production equipment according to claim 9, wherein the processor of the vapor deposition device sets a maximum number of vapor deposition processes is five, and the processor of the thin film packaging device sets a maximum number of thin film packaging processes is five.

* * * * *